(12) United States Patent
Sung et al.

(10) Patent No.: US 12,207,532 B2
(45) Date of Patent: Jan. 21, 2025

(54) DISPLAY APPARATUS AND METHOD OF MANUFACTURING THE SAME

(71) Applicant: Samsung Display Co., Ltd., Yongin-si (KR)

(72) Inventors: Sijin Sung, Yongin-si (KR); Jaehong Kim, Yongin-si (KR); Hyomin Kim, Yongin-si (KR); Illsoo Park, Yongin-si (KR); Jongseok Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 448 days.

(21) Appl. No.: 17/574,184

(22) Filed: Jan. 12, 2022

(65) Prior Publication Data

US 2022/0359851 A1 Nov. 10, 2022

(30) Foreign Application Priority Data

May 10, 2021 (KR) .................. 10-2021-0060336

(51) Int. Cl.
| | | |
|---|---|---|
| *H01L 29/08* | (2006.01) | |
| *B08B 5/00* | (2006.01) | |
| *H10K 50/81* | (2023.01) | |
| *H10K 59/122* | (2023.01) | |
| *H10K 71/00* | (2023.01) | |
| *H10K 59/12* | (2023.01) | |
| *H10K 102/10* | (2023.01) | |

(52) U.S. Cl.
CPC .............. *H10K 71/00* (2023.02); *B08B 5/00* (2013.01); *H10K 50/81* (2023.02); *H10K 59/122* (2023.02); *H10K 59/1201* (2023.02); *H10K 2102/103* (2023.02)

(58) Field of Classification Search
CPC ...... H10K 71/00; H10K 50/81; H10K 59/122; H10K 59/1201; H10K 2102/103; H10K 59/8051; H10K 71/851; H10K 71/231; B08B 5/00; H01L 21/02046; H01L 21/31127
USPC ........................................... 257/40
See application file for complete search history.

(56) References Cited

U.S. PATENT DOCUMENTS

| | | | |
|---|---|---|---|
| 5,776,622 A | 7/1998 | Hung et al. | |
| 9,601,722 B2 | 3/2017 | Lee et al. | |
| 2007/0262299 A1* | 11/2007 | Kho | H10K 59/80518 257/40 |
| 2021/0210686 A1 | 7/2021 | Sung et al. | |

FOREIGN PATENT DOCUMENTS

| | | |
|---|---|---|
| JP | 5168762 | 3/2013 |
| KR | 10-0712181 | 4/2007 |
| KR | 10-2017-0019562 | 2/2017 |
| KR | 10-2021-0088800 | 7/2021 |

* cited by examiner

*Primary Examiner* — Tan N Tran
(74) *Attorney, Agent, or Firm* — KILE PARK REED & HOUTTEMAN PLLC

(57) ABSTRACT

A method of manufacturing a display apparatus includes forming a first electrode on a substrate, forming a pixel-defining layer on the first electrode, the pixel-defining layer including an opening through which at least part of the first electrode is exposed, and performing a first dry cleaning on a surface of the at least part of the first electrode that is exposed through the opening. An indium-fluorine bond is formed on the surface of the at least part of the first electrode through the first dry cleaning.

10 Claims, 17 Drawing Sheets

DISPLAY APPARATUS AND METHOD OF MANUFACTURING THE SAME

CROSS-REFERENCE TO RELATED APPLICATION(S)

This application claims priority to and benefits of Korean Patent Application No. 10-2021-0060336 under 35 U.S.C. § 119, filed on May 10, 2021, in the Korean Intellectual Property Office, the entire contents of which are incorporated herein by reference.

BACKGROUND

1. Technical Field

The embodiments relate to a display apparatus and a method of manufacturing the same.

2. Description of the Related Art

Display apparatuses visually display data. A display apparatuses are used as displays for a small products such as a mobile phones or as displays for large products such as a television.

A display apparatus includes pixels that emit light by receiving an electrical signal to display an image to the outside. Each pixel includes a light-emitting device. For example, an organic light-emitting display apparatus includes an organic light-emitting diode (OLED) as a light-emitting device. In general, in an organic light-emitting display apparatus, a thin-film transistor and an OLED are formed on a substrate, and the OLED emits light by itself.

Various designs of display apparatuses have been attempted to improve the quality of display apparatuses. Research to extend the life of light-emitting devices included in a display apparatus has been actively conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The embodiments relate to a display apparatus which may extend the life a light-emitting device and a method of manufacturing such a display apparatus. However, the embodiments are examples, and do not limit the scope of the disclosure.

Aspects of the embodiments will be set forth in the description which follows.

According to an embodiment, a method of manufacturing a display apparatus may include forming a first electrode on a substrate, forming a pixel-defining layer on the first electrode, the pixel-defining layer including an opening through which at least part of the first electrode is exposed, and performing a first dry cleaning on a surface of the at least part of the first electrode that is exposed through the opening. An indium-fluorine bond may be formed on the surface of the at least part of the first electrode through the first dry cleaning.

The performing of the first dry cleaning may include removing an organic residue from the surface of the at least part of the first electrode.

The organic residue and the pixel-defining layer may include a same material as.

A time of the performing of the first dry cleaning may be in a range of about 15 seconds to about 45 seconds.

An etch rate of the performing of the first dry cleaning may be in a range of about 500 Å/min to about 1500 Å/min.

The performing of the first dry cleaning may use an oxygen gas.

The first electrode may include indium tin oxide.

The surface of the first electrode may exhibit a peak in a binding energy in a range of about 683 eV to about 687 eV of an X-ray photoelectron spectroscopy spectrum.

The method may further include, before the forming of the first electrode on the substrate, forming a planarization layer on the substrate, forming a via hole in the planarization layer, and performing a second dry cleaning on the planarization layer and the via hole.

An etch rate of the performing of the second dry cleaning may be in a range of about 500 Å/min to about 1500 Å/min.

A time of the performing of the second dry cleaning may be in a range of about 15 seconds to about 45 seconds.

The performing of the second dry cleaning may use an oxygen gas.

The method may further include, after the performing of the first dry cleaning, forming an intermediate layer on the first electrode, and forming a second electrode on the intermediate layer.

The intermediate layer may include an organic material.

The pixel-defining layer may include fluorine.

According to an embodiment, a display apparatus may include a first electrode located on a substrate, and a pixel-defining layer located on the first electrode. The pixel-defining layer may include an opening through which at least art of a surface of the first electrode is exposed. An indium-fluorine bond may be formed on the at least part of the surface of the first electrode.

The first electrode may include indium tin oxide.

The surface of the first electrode may exhibit a peak in a binding energy in a range of about 683 eV to about 687 eV of an X-ray photoelectron spectroscopy (XPS) spectrum.

The display apparatus may further include an intermediate layer on the first electrode, and a second electrode on the intermediate layer.

The intermediate layer may include an organic material.

The pixel-defining layer may include fluorine.

Other aspects, features, and advantages of the disclosure will become more apparent from the detailed description, the claims, and the drawings.

BRIEF DESCRIPTION OF THE DRAWINGS

The above and other aspects, features, and advantages of the embodiments will be more apparent from the following description taken in conjunction with the accompanying drawings, in which.

DETAILED DESCRIPTION OF THE EMBODIMENTS

Figure 1:
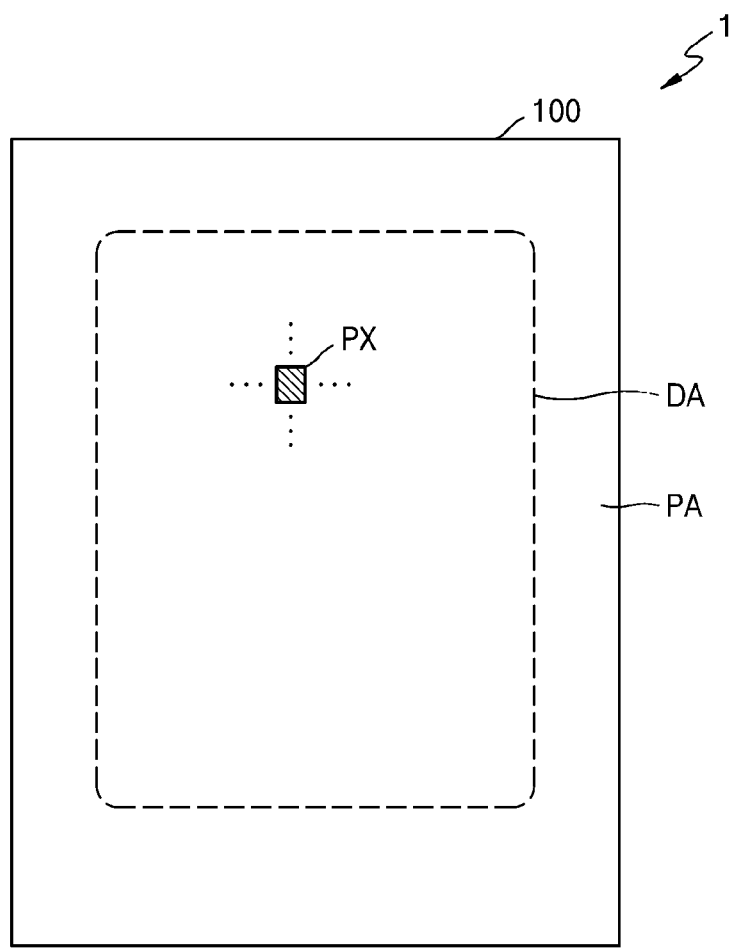
FIG. 1 is a schematic plan view illustrating a display apparatus, according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of description, the disclosure is not limited thereto.

In the following embodiments, when a wiring "extends in a first direction or a second direction," it may mean that the wiring extends not only in a linear shape but also in a zigzag or curved shape in the first direction or the second direction.

In the following embodiments, "a plan view of an object" refers to "a view of an object seen from above, and "a cross-sectional view of an object" refers to "a view of an object vertically cut and seen from the side. In the following embodiments, when elements "overlap," it may mean that the elements overlap in a "plan view" and a "cross-sectional view". The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Hereinafter, embodiments will be described in detail with reference to the accompanying drawings, wherein the same or corresponding elements are denoted by the same reference numerals throughout.

FIG. 1 is a schematic plan view illustrating a display apparatus, according to an embodiment.

Referring to FIG. 1, a display apparatus 1 may include a display area DA where an image is displayed, and a peripheral area PA located around the display area DA. The display apparatus 1 may provide an image to the outside by using light emitted from the display area DA.

A substrate 100 may include any of various materials, for example, glass, a metal, or plastic. In an embodiment, the substrate 100 may include a flexible material. The term "flexible material" may refer to a material that is well bendable, foldable, or rollable. The substrate 100 including the flexible material may include ultra-thin glass, metal, or plastic.

Pixels PX including display elements such as an organic light-emitting diode (OLED) may be located in the display area DA of the substrate 100. The pixels PX may include multiple pixels arranged in patterns such as a stripe pattern, a PENTILE™ pattern, or a mosaic pattern to form an image.

In a plan view, the display area DA may have a rectangular shape as shown in FIG. 1. In an embodiment, the display area DA may have a polygonal shape (e.g., a triangular shape, a pentagonal shape, or a hexagonal shape), a circular shape, an elliptical shape, or an irregular shape.

The peripheral area PA of the substrate 100 located around the display area DA may be an area where an image is not displayed. Various wirings for transmitting electric signals to be applied to the display area DA, and pads to which a printed circuit board or a driver integrated circuit (IC) chip is attached may be located in the peripheral area PA.

Figure 2:
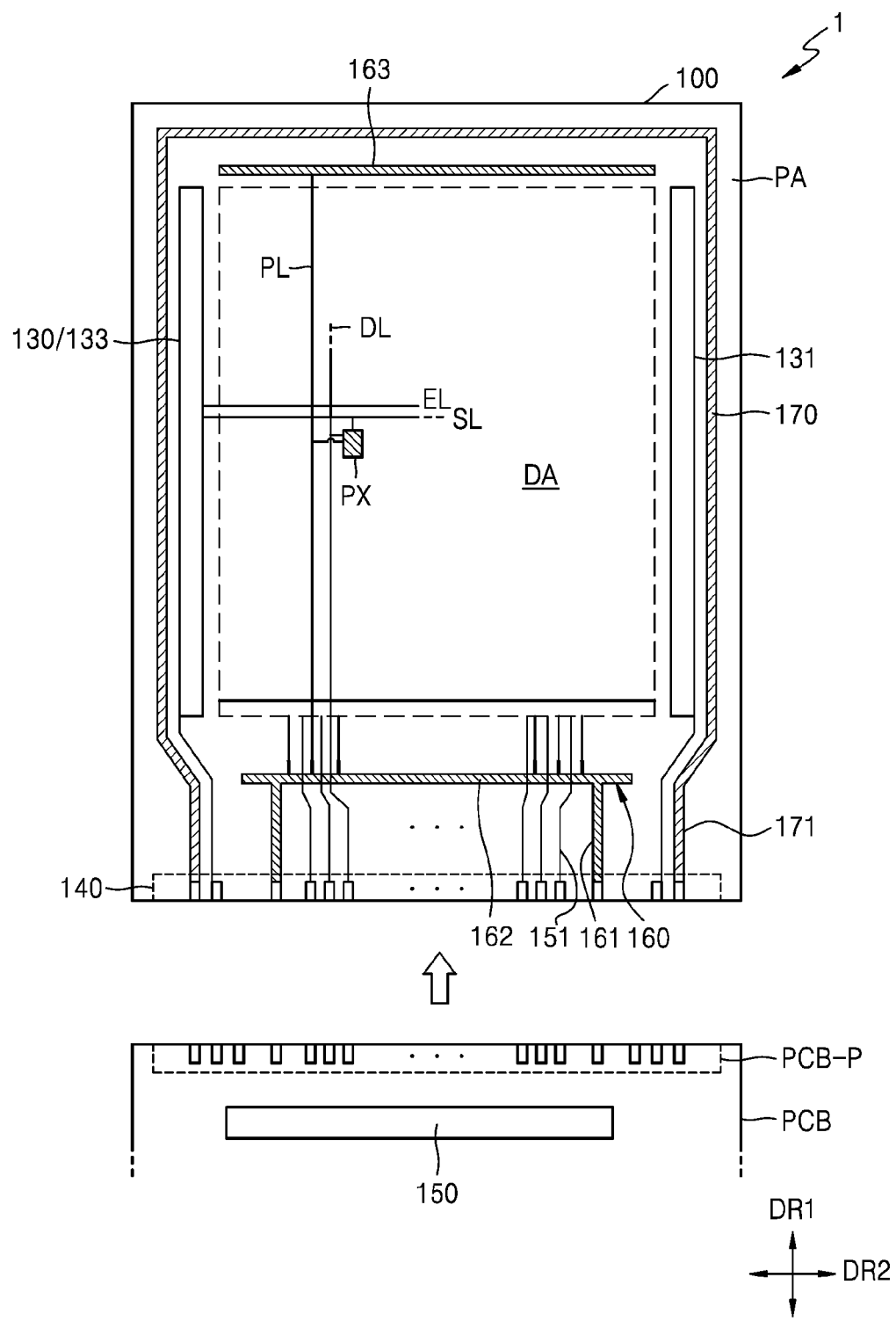
FIG. 2 is a schematic plan view illustrating a display panel, according to an embodiment.

FIG. 2 is a schematic plan view illustrating a display panel, according to an embodiment.

Referring to FIG. 2, the display apparatus 1 may include the display area DA and the peripheral area PA, and may include pixels PX located in the display area DA. Each of the pixels PX may include a display element such as an OLED. Each pixel PX may emit light, for example, red light, green light, blue light, or white light, through the OLED. The pixels PX refer to sub-pixels that emit light of different colors, and each pixel PX may be, for example, a red (R) sub-pixel, a green (G) sub-pixel, or a blue (B) sub-pixel. The display area DA may be covered with an encapsulation member (not shown) to be protected from the external air or moisture.

Each pixel PX may be electrically connected to outer circuits located in the peripheral area PA. A first scan driving circuit 130, a second scan driving circuit 131, an emission control driving circuit 133, a terminal 140, a data driving circuit 150, a first power supply wiring 160, and a second power supply wiring 170 may be located in the peripheral area PA.

Each of the first scan driving circuit 130 and the second scan driving circuit 131 may apply a scan signal to each pixel PX through a scan line SL. The second scan driving circuit 131 and the first scan driving circuit 130 may be parallel to each other with the display area DA therebetween. Some of the pixels PX located in the display area DA may be electrically connected to the first scan driving circuit 130, and the other pixels PX may be electrically connected to the second scan driving circuit 131. In other embodiments, the second scan driving circuit 131 may be omitted.

The emission control driving circuit 133 may apply an emission control signal to each pixel PX through an emission control line EL.

The terminal 140 may be located on a side of the substrate 100. The terminal 140 may be exposed without being covered by an insulating layer, and may be electrically connected to a printed circuit board PCB. A terminal portion PCB-P of the printed circuit board PCB may be electrically connected to the terminal 140 of the display apparatus 1. The printed circuit board PCB may transmit a signal or power of a controller (not shown) to the display apparatus 1.

A control signal generated by the controller may be transmitted to the first and second scan driving circuits 130 and 131 through the printed circuit board PCB. The controller may respectively provide first and second power supply voltages ELVDD and ELVSS (refer to FIG. 3) to the first and second power supply wirings 160 and 170 through first and second connection wirings 161 and 171. The first power supply voltage ELVDD may be provided to each pixel PX through a driving voltage line PL electrically connected to the first power supply wiring 160, and the second power supply voltage ELVSS may be provided to a second electrode 230 (refer to FIG. 4) of each pixel PX electrically connected to the second power supply wiring 170.

The data driving circuit 150 may be electrically connected to a data line DL. A data signal of the data driving circuit 150 may be applied to each pixel PX through a connection wiring 151 electrically connected to the terminal 140 and the data line DL electrically connected to the connection wiring 151. Although the data driving circuit 150 is located on the printed circuit board PCB in FIG. 2, the disclosure is not limited thereto. In an embodiment, the data driving circuit 150 may be located on the substrate 100. For example, the data driving circuit 150 may be located between the terminal 140 and the first power supply wiring 160.

The first power supply wiring 160 may include a first sub-wiring 162 and a second sub-wiring 163 that extend parallel to each other in a second direction DR2 with the display area DA therebetween. The second power supply wiring 170 may partially surround the display area DA in a loop shape with an open side.

Figure 3:
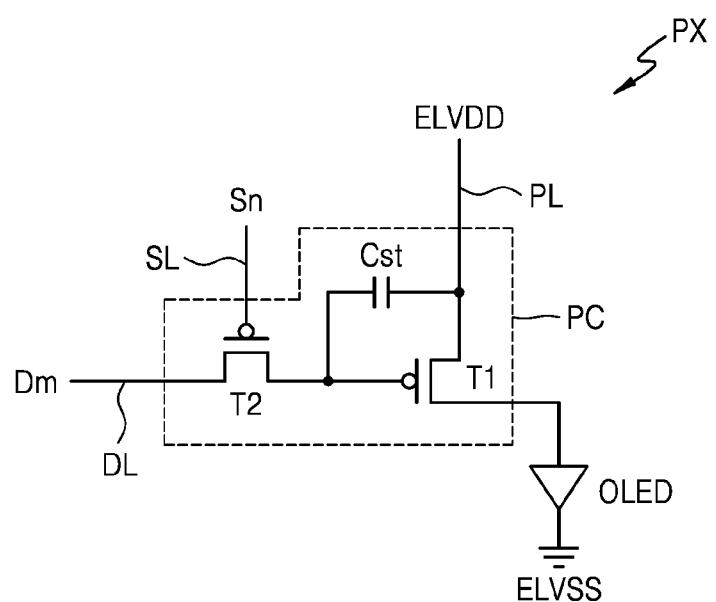
FIG. 3 is a schematic diagram of an equivalent circuit illustrating a pixel of a display apparatus, according to an embodiment.

FIG. 3 is an equivalent circuit diagram schematically illustrating a pixel of a display apparatus, according to an embodiment.

Referring to FIG. 3, each pixel PX may include a pixel circuit PC electrically connected to the scan line SL and the data line DL, and an organic light-emitting diode OLED electrically connected to the pixel circuit PC.

The pixel circuit PC may include a driving thin-film transistor T1, a switching thin-film transistor T2, and a storage capacitor Cst. The switching thin-film transistor T2 may be electrically connected to the scan line SL and the data line DL, and may transmit a data signal Dm input through the data line DL to the driving thin-film transistor T1 according to a scan signal Sn input through the scan line SL.

The storage capacitor Cst may be electrically connected to the switching thin-film transistor T2 and the driving voltage line PL, and may store a voltage corresponding to a difference between a voltage received from the switching thin-film transistor T2 and a driving voltage ELVDD supplied to the driving voltage line PL.

The driving thin-film transistor T1 may be electrically connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a luminance according to the driving current.

Although the pixel circuit PC includes two thin-film transistors and a storage capacitor in FIG. 3, the disclosure is not limited thereto. For example, the pixel circuit PC may include three or more thin-film transistors and/or two or more storage capacitors.

Figure 4:
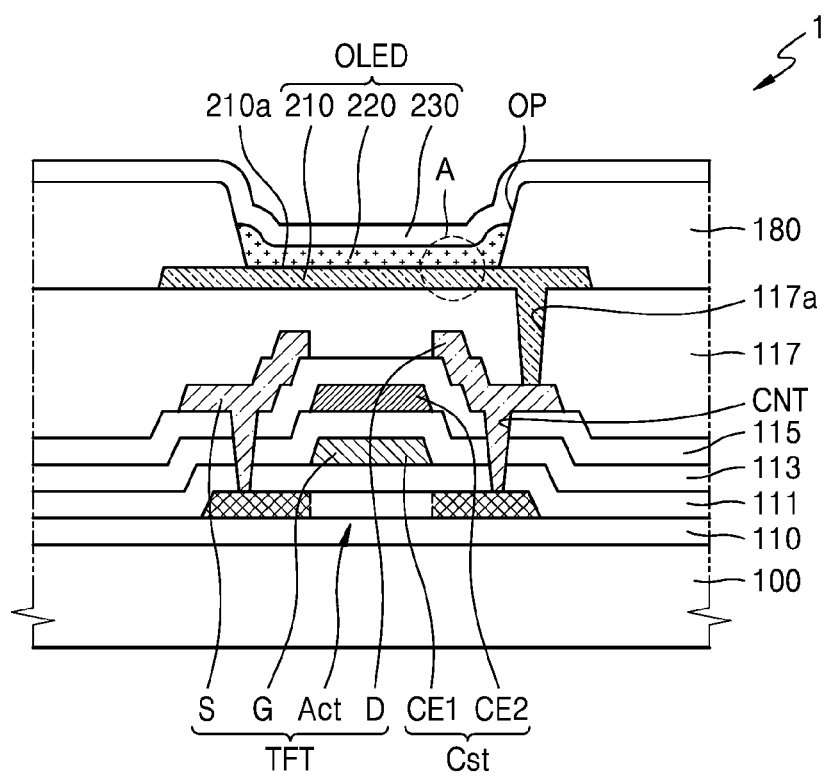
FIG. 4 is a schematic cross-sectional view illustrating a display apparatus, according to an embodiment.

FIG. 4 is a schematic cross-sectional view illustrating a display apparatus, according to an embodiment.

Referring to FIG. 4, the display apparatus 1 may include the substrate 100, a thin-film transistor TFT, the storage capacitor Cst, and the organic light-emitting diode OLED.

The substrate 100 may include a glass material, a ceramic material, a metal material, or a flexible or bendable material. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single or multi-layer structure including the above material. When the substrate 100 has a multi-layer structure, the substrate 100 may further include an inorganic layer. In an embodiment, the substrate 100 may have a structure including an organic material, an inorganic material, an organic material, and an inorganic material.

A buffer layer 110 may be located on the substrate 100. The buffer layer 110 may include silicon oxide ($SiO_X$) or silicon nitride ($SiN_X$).

A semiconductor layer Act may be located on the buffer layer 110. In an embodiment, the semiconductor layer Act may include an oxide semiconductor or a silicon semiconductor. In an embodiment, when the semiconductor layer Act includes an oxide semiconductor, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer Act may be an InSnZnO (ITZO) semiconductor layer or an InGaZnO (IGZO) semiconductor layer. In an embodiment, when the semiconductor layer Act includes a silicon semiconductor, the semiconductor layer Act may include amorphous silicon (a-Si), or low temperature poly-silicon (LTPS) crystallized from amorphous silicon (a-Si).

In an embodiment, the semiconductor layer Act may include a channel region overlapping a gate electrode G, and a source region and a drain region on both sides of the channel region. The source region and the drain region may have a higher impurity concentration than the channel region. Impurities of the source region and the drain region may be N-type impurities or P-type impurities. The source region and the drain region may be respectively electrically connected to a source electrode S and a drain electrode D.

A first insulating layer 111 may be located on the semiconductor layer Act. The first insulating layer 111 may include an inorganic material including oxide or nitride. In an embodiment, the first insulating layer 111 may include at least one of silicon oxide ($SiO_X$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_X$). The zinc oxide ($ZnO_X$) may include zinc oxide (ZnO) and/or zinc peroxide ($ZnO_2$). The first insulating layer 111 may have a single or multi-layer structure including an inorganic insulating material.

The gate electrode G may be located on the first insulating layer 111 and may at least partially overlap the semiconductor layer Act. The gate electrode G may include molybdenum (Mo), aluminum (Al), copper (Cu), or titanium (Ti), and may have a single or multi-layer structure. For example, the gate electrode G may have a single-layer structure including Mo.

A second insulating layer 113 may be located on the gate electrode G. The second insulating layer 113 may include at least one inorganic insulating material selected from the group consisting of silicon oxide ($SiO_X$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_X$). The zinc oxide ($ZnO_X$) may include zinc oxide (ZnO) and/or zinc peroxide ($ZnO_2$). The second insulating layer 113 may have a single or multi-layer structure including the inorganic insulating material.

The storage capacitor Cst may be located on the first insulating layer 111. The storage capacitor Cst may include a lower electrode CE1 and an upper electrode CE2 overlapping the lower electrode CE1. The lower electrode CE1 and the upper electrode CE2 of the storage capacitor Cst may overlap each other with the second insulating layer 113 therebetween. The second insulating layer 113 may function as a dielectric layer of the storage capacitor Cst.

In an embodiment, the lower electrode CE1 of the storage capacitor Cst may overlap the gate electrode G of the thin-film transistor TFT, and the lower electrode CE1 of the storage capacitor Cst and the gate electrode G of the thin-film transistor TFT may be formed to be integral with each other. In an embodiment, the lower electrode CE1 of the storage capacitor Cst may be spaced apart from the gate electrode G of the thin-film transistor TFT and may be located as a separate independent element on the first insulating layer 111. The lower electrode CE1 of the storage capacitor Cst and the gate electrode G may be located on the same layer to be spaced apart from each other.

The upper electrode CE2 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single or multi-layer structure including the above material.

A third insulating layer 115 may be located on the upper electrode CE2 of the storage capacitor Cst. The third insulating layer 115 may include at least one inorganic insulating material selected from the group consisting of silicon oxide ($SiO_X$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_X$). The zinc oxide ($ZnO_X$) may include zinc oxide (ZnO) and/or zinc peroxide ($ZnO_2$). The third insulating layer 115 may have a single or multi-layer structure including the inorganic insulating material.

The source electrode S and/or the drain electrode D may be located on the third insulating layer 115. The source electrode S and/or the drain electrode D may include a conductive material including molybdenum (Mo), aluminum (Al), copper (Cu), or titanium (Ti), and may have a single or multi-layer structure including the above material. In an embodiment, the source electrode S and/or the drain electrode D may have a multi-layer structure including Ti/Al/Ti.

In an embodiment, the source electrode S and the drain electrode D may be respectively electrically connected to the source region and the drain region through contact holes CNT formed in the first insulating layer 111, the second insulating layer 113, and the third insulating layer 115.

A planarization layer 117 may be located on the source electrode S and the drain electrode D. The planarization layer 117 may have a single or multi-layer structure including an organic material or an inorganic material. In an embodiment, the planarization layer 117 may include a general-purpose polymer such as benzocyclobutene, polyimide, hexamethyldisiloxane, polymethylmethacrylate, or polystyrene, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend thereof. In other embodiments, the planarization layer 117 may include silicon oxide ($SiO_X$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). The zinc oxide ($ZnO_X$) may include zinc oxide (ZnO) and/or zinc peroxide ($ZnO_2$). After the planarization layer 117 is formed, chemical mechanical polishing may be performed to provide a flat top surface.

Although not shown in FIG. 4, the planarization layer 117 may have a multi-layer structure including a first planarization layer and a second planarization layer.

A light-emitting device may be located on the planarization layer 117. In an embodiment, the light-emitting device may be the organic light-emitting diode OLED. In an embodiment, the organic light-emitting diode OLED may include a first electrode 210, an intermediate layer 220, and a second electrode 230. The first electrode 210 may be an anode, and the second electrode 230 may be a cathode.

The first electrode 210 may be located on the planarization layer 117. The first electrode 210 may be a (semi-)transmissive electrode or a reflective electrode. The first electrode 210 may include a reflective film including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the first electrode 210 may have a structure in which ITO/Ag/ITO are sequentially stacked. An outermost layer of the first electrode 210 may include indium tin oxide (ITO).

In an embodiment, the first electrode 210 may be electrically connected to the source electrode S or the drain electrode D through a via hole 117a defined in the planarization layer 117.

A pixel-defining layer 180 may be located on the planarization layer 117, and the pixel-defining layer 180 may have an opening OP through which at least a part of the first electrode 210 is exposed. At least a part of a surface 210a of the first electrode 210 may be exposed through the opening OP defined in the pixel-defining layer 180.

In an embodiment, an area exposed through the opening OP of the pixel-defining layer 180 may be defined as an emission area. Also, an area around the emission area is a non-emission area, and the non-emission area may at least partially surround the emission area. The display area DA (refer to FIG. 1) may include emission areas, and a non-emission area surrounding the emission areas. The pixel-defining layer 180 may increase a distance between the first electrode 210 and the second electrode 230 located on the first electrode 210, to prevent an arc or the like from occurring on an edge of the first electrode 210.

The pixel-defining layer 180 may include an organic insulating material. In other embodiments, the pixel-defining layer 180 may include an inorganic insulating material such as silicon nitride, silicon oxynitride, or silicon oxide. In other embodiments, the pixel-defining layer 180 may include an organic insulating material and an inorganic insulating material. In an embodiment, the pixel-defining layer 180 may include a light-blocking material, and may be black. The light-blocking material may include a resin or paste including carbon black, carbon nanotubes, or a black dye, metal particles such as nickel, aluminum, molybdenum, or an alloy thereof, metal oxide particles (e.g., chromium oxide), or metal nitride particles (e.g., chromium nitride). When the pixel-defining layer 180 includes a light-blocking material, reflection of external light by metal structures located under the pixel-defining layer 180 may be reduced. In an embodiment, the pixel-defining layer 180 may contain fluorine (F).

Although not shown in FIG. 4, a spacer may be located on the pixel-defining layer 180. The spacer may include an organic insulating material such as polyimide. In other embodiments, the spacer may include an inorganic insulating material such as silicon nitride ($SiN_X$) or silicon oxide ($SiO_X$), or may include an organic insulating material and an inorganic insulating material.

In an embodiment, the spacer and the pixel-defining layer 180 may include a same material. The pixel-defining layer 180 and the spacer may be formed together in a mask process using a halftone mask or the like. In other embodiments, the spacer and the pixel-defining layer 180 may include different materials.

The intermediate layer 220 may be located on the first electrode 210 the at least part of which is exposed by the pixel-defining layer 180. In an embodiment, the intermediate layer 220 may include an organic material. The intermediate layer 220 may include a first functional layer, an emission layer, and a second functional layer. The first functional layer and the second functional layer may be respectively selectively located under and over the emission layer. In an embodiment, the first functional layer may be located under the emission layer, and the second functional layer may be located over the emission layer. The first functional layer and the second functional layer located under and over the emission layer may be collectively referred to as organic functional layers.

The first functional layer may include a hole injection layer HIL and/or a hole transport layer HTL, and the second functional layer may include an electron transport layer ETL and/or an electron injection layer EIL.

The emission layer may include an organic material including a fluorescent or phosphorescent material that emits red, green, blue, or white light. The emission layer may include a low-molecular-weight organic material or a high-molecular-weight organic material.

When the emission layer includes a low-molecular-weight organic material, the intermediate layer 220 may have a single or stacked structure in which a hole injection layer, a hole transport layer, an emission layer, an electron transport layer, and an electron injection layer are stacked. Examples of the low-molecular-weight organic material may include various organic materials such as copper phthalocyanine (CuPc), N,N'-Di(napthalene-1-yl)-N,N'-diphenyl-benzidine (NPB), and tris-8-hydroxyquinoline aluminum (Alq3).

When the emission layer includes a high-molecular-weight organic material, the intermediate layer 220 may have a structure including a hole transport layer and an emission layer. The hole transport layer may include poly (3,4-ethylenedioxythiophene) (PEDOT), and the emission layer may include a high molecular weight material such as a polyphenylene vinylene (PPV)-based material or a polyfluorene-based material. The emission layer may be formed by using screen printing, inkjet printing, or laser-induced thermal imaging (LITI).

The second electrode 230 may be located on the intermediate layer 220. The second electrode 230 may be located on the intermediate layer 220, to cover the entire intermediate layer 220. The second electrode 230 may be located in the display area DA (refer to FIG. 1), to cover the entire display area DA. The second electrode 230 may be integrally formed throughout the display area to cover the pixels PX located in the display area DA by using an open mask. However, the disclosure is not limited thereto.

The second electrode 230 may include a conductive material having a low work function. For example, the second electrode 230 may include a (semi-)transparent layer including silver (Ag), magnesium (Mg), aluminum (Al) platinum (Pt), palladium (Pd), gold (Au), nickel (Ni), neodymium (Nd), iridium (Ir), chromium (Cr), lithium (Li), calcium (Ca), or an alloy thereof. In other embodiments, the second electrode 230 may further include a layer formed of ITO, IZO, ZnO, or $In_2O_3$ on the (semi-)transparent layer including the above material.

Figure 5:
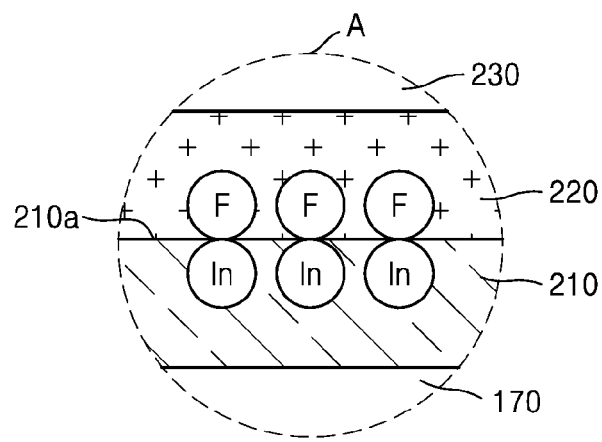
FIG. 5 is an enlarged schematic view illustrating a region A of FIG. 4.

FIG. 5 is an enlarged schematic view illustrating a region A of FIG. 4.

Referring to FIG. 5, in an embodiment, an indium-fluorine (In—F) bond may exist on the surface 210a of the first electrode 210. Because the indium-fluorine (In—F) bond exists on the surface 210a of the first electrode 210, the work function of the surface 210a of the first electrode 210 may increase and hole injection characteristics may be improved, and thus the characteristics of the organic light-emitting diode OLED may be improved.

FIGS. 6 through 14 are schematic cross-sectional views illustrating a method of manufacturing a display apparatus, according to an embodiment.

A method of manufacturing a display apparatus will now be described with reference to FIGS. 6 through 14.

In an embodiment, a method of manufacturing a display apparatus may include forming the first electrode 210 on the substrate 100, forming, on the first electrode 210, the pixel-defining layer 180 having the opening OP through which at least a part of the first electrode 210 is exposed, and performing second dry cleaning on the surface 210a of the first electrode 210, the at least part of which is exposed through the opening OP. Also, before the forming of the first electrode 210 on the substrate 100, the method of manufacturing a display apparatus may further include forming the planarization layer 117 on the substrate 100, forming the via hole 117a in the planarization layer 117, and performing first dry cleaning on the planarization layer 117 and the via hole 117a, and after the performing of the second dry cleaning, the method of manufacturing a display apparatus may further include forming the intermediate layer 220 on the first electrode 210 and forming the second electrode 230 on the intermediate layer 220.

Figure 6:
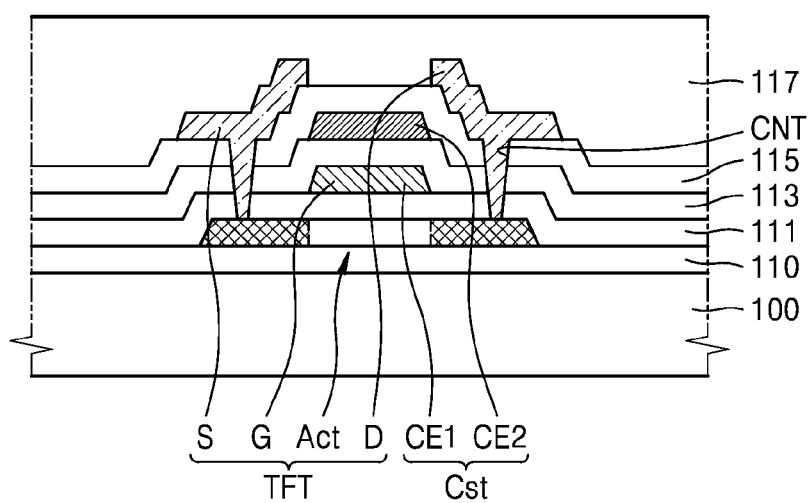
FIGS. 6 through 14 are schematic cross-sectional views illustrating a method of manufacturing a display apparatus, according to an embodiment.

Referring to FIG. 6, the planarization layer 117 may be formed on the substrate 100. In the forming of the planarization layer 117 on the substrate 100, the buffer layer 110, the semiconductor layer Act, the first insulating layer 111, the gate electrode G, the second insulating layer 113, the upper electrode CE2, the third insulating layer 115, the source electrode S, and the planarization layer 117 may be sequentially formed on the substrate 100.

The substrate 100 may include a glass material, a ceramic material, a metal material, or a flexible or bendable material. In an embodiment, after the above elements are stacked on a mother substrate, the mother substrate may be separated into multiple substrates 100 through laser cutting.

The buffer layer 110 may be formed on the substrate 100. The buffer layer 110 may include silicon oxide ($SiO_x$) or silicon nitride ($SiN_x$), and may be formed by using a deposition method such as chemical vapor deposition (CVD) or sputtering.

A barrier layer (not shown) may be further provided between the substrate 100 and the buffer layer 110. The barrier layer may prevent or minimize impurities from the substrate 100, etc. from penetrating into the semiconductor layer Act. The barrier layer may include an inorganic material such as oxide or nitride, an organic material, or a combination of an organic material and an inorganic material, and may have a single or multi-layer structure including an inorganic material and an organic material.

The semiconductor layer Act may be formed on the buffer layer 110. The semiconductor layer Act may be formed by patterning a pre-semiconductor layer (not shown). The pre-semiconductor layer may be formed of amorphous silicon or an oxide semiconductor, and may be deposited by using CVD. Also, when the pre-semiconductor layer is an amorphous silicon layer, the pre-semiconductor layer may be formed and then crystalized by using any of various methods such as rapid thermal annealing (RTA), solid phase crystallization (SPC), excimer laser annealing (ELA), metal induced crystallization (MIC), metal induced lateral crystallization (MILC), or sequential lateral solidification (SLS) to form a poly-crystalline silicon layer.

In an embodiment, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a channel region, and a source region and a drain region formed on both sides of the channel region. The semiconductor layer Act may have a single or multi-layer structure.

The first insulating layer 111 may be formed on the semiconductor layer Act, and the gate electrode G may be formed on the first insulating layer 111. The gate electrode G may at least partially overlap the semiconductor layer Act formed under the gate electrode G. For example, a portion of the semiconductor layer Act overlapping the gate electrode G may be the channel region. In an embodiment, the lower electrode CE1 of the storage capacitor Cst may be formed on the first insulating layer 111. The lower electrode CE1 of the storage capacitor Cst and the gate electrode G may be integral with each other. However, the disclosure is not limited thereto. The lower electrode CE1 of the storage capacitor Cst may be spaced apart from the gate electrode G.

The second insulating layer 113 may be formed on the gate electrode G, and the upper electrode CE2 of the storage capacitor Cst may be formed on the second insulating layer 113. The upper electrode CE2 may at least partially overlap the lower electrode CE1 located under the upper electrode CE2.

The third insulating layer 115 may be formed on the upper electrode CE2 of the storage capacitor Cst, and the source electrode S and the drain electrode D may be formed on the third insulating layer 115. The source electrode S and the drain electrode D may be respectively electrically connected to the source region and the drain region of the semiconductor layer Act through the contact holes CNT defined in the first insulating layer 111 through the third insulating layer 115.

The source electrode S and the drain electrode D may be covered by an inorganic protective layer (not shown). The inorganic protective layer may have a single or multi-layer structure including silicon nitride ($SiN_x$) and silicon oxide ($SiO_x$). The inorganic protective layer may be used to cover and protect some wirings located on the third insulating layer 115.

The planarization layer 117 may be formed on the third insulating layer 115 to cover the source electrode S and the drain electrode D. In an embodiment, the planarization layer 117 may include an organic material. For example, the planarization layer 117 may include a general-purpose polymer such as benzocyclobutene, polyimide, hexamethyldisiloxane, polymethylmethacrylate, or polystyrene, a polymer derivative having a phenolic group, an acrylic polymer, an imide-based polymer, an aryl ether-based polymer, an amide-based polymer, a fluorine-based polymers, a p-xylene-based polymer, a vinyl alcohol-based polymer, or a blend thereof.

Figure 7:
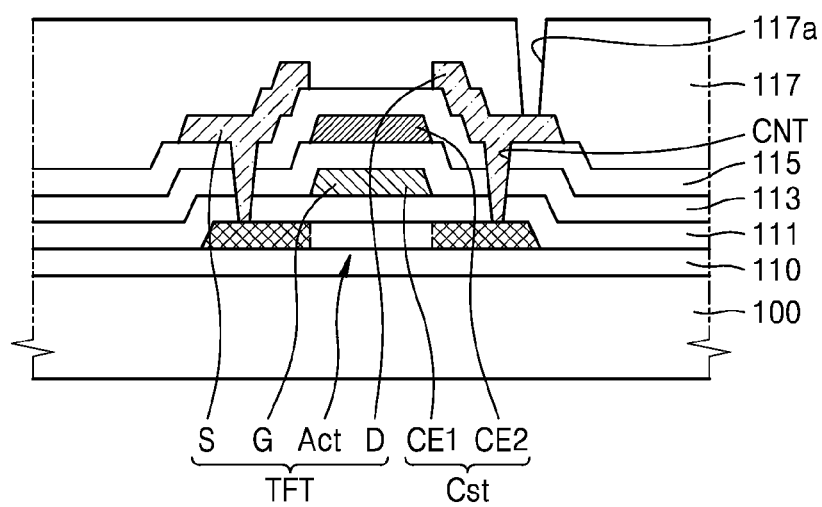

Referring to FIG. 7, after the planarization layer 117 is formed on the substrate 100, the via hole 117a may be formed in the planarization layer 117. In an embodiment, the via hole 117a may be formed by using a mask process. At least a part of the drain electrode D or at least a part of the source electrode S may be exposed through the via hole 117a of the planarization layer 117.

Figure 8:
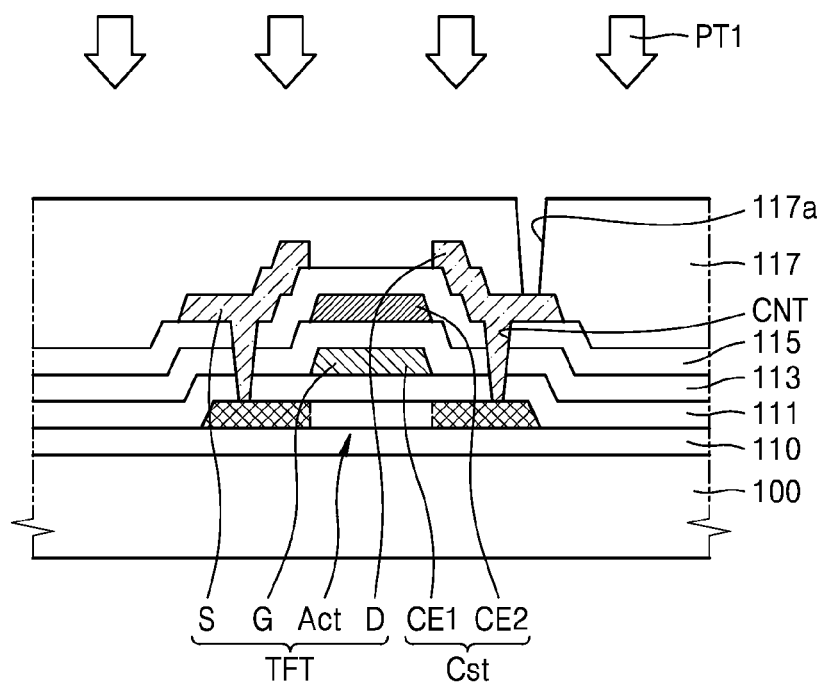

Referring to FIG. 8, after the via hole 117a is formed in the planarization layer 117, first dry cleaning PT1 may be performed on the planarization layer 117 and the via hole 117a. In an embodiment, the first dry cleaning PT1 may be plasma treatment. The plasma treatment is a method of applying high frequency waves to an oxygen ($O_2$) gas or an argon (Ar) gas to generate plasma and irradiating the plasma to a surface of the planarization layer 117 and the via hole 117a to clean the surface of the planarization layer 117 and the via hole 117a through a chemical reaction.

In an embodiment, the first dry cleaning PT1 may be performed by injecting the oxygen ($O_2$) gas. Because the partial pressure of the oxygen ($O_2$) gas is higher than other gases, the oxygen gas may effectively remove any residue or the like of the planarization layer 117 that was left when the via hole 117a was formed.

In an embodiment, the first dry cleaning PT1 may involve applying pressure, and may involve applying source power and bias power.

In an embodiment, the first dry cleaning PT1 may be performed at an etch rate of about 500 Å/min to about 1500 Å/min. In other embodiments, the first dry cleaning PT1 may be performed for about 15 seconds to about 45 seconds. The first dry cleaning PT1 may be performed at an etch rate in a range of about 500 Å/min to about 1500 Å/min in a time range of about 15 seconds to about 45 seconds. In an embodiment, the first dry cleaning PT1 may be performed at an etch rate of about 900 Å/min for about 30 seconds.

Figure 9:
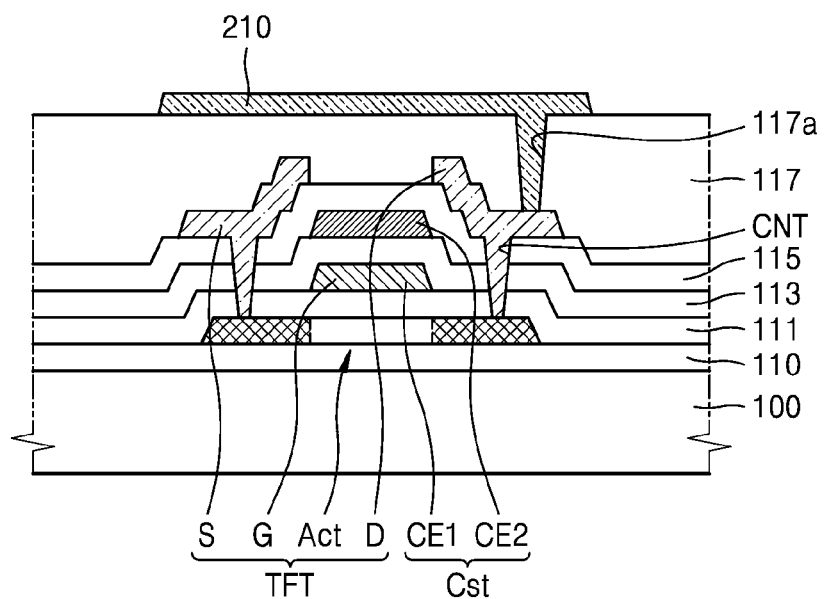

Referring to FIG. 9, after the first dry cleaning PT1 is performed on the planarization layer 117 and the via hole 117a, the first electrode 210 may be formed on the planarization layer 117.

In an embodiment, the first electrode 210 may be electrically connected to the drain electrode D or the source electrode S through the via hole 117a defined in the planarization layer 117.

In an embodiment, the first electrode 210 may be a (semi-)transmissive electrode or a reflective electrode. In some embodiments, the first electrode 210 may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the first electrode 210 may include ITO/Ag/ITO.

Figure 10:
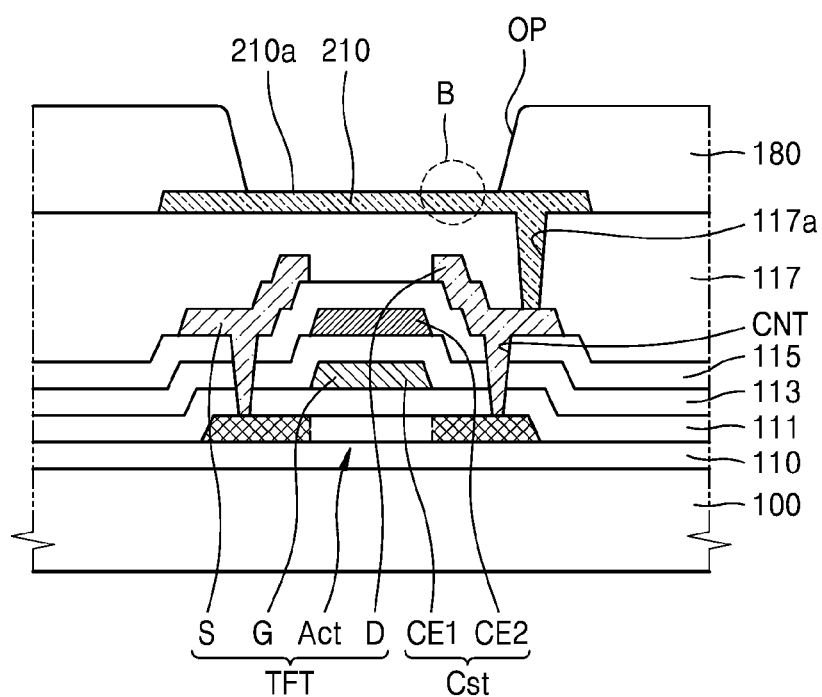

Referring to FIG. 10, after the first electrode 210 is formed on the planarization layer 117, the pixel-defining layer 180 may be formed.

In an embodiment, the pixel-defining layer 180 may be formed on the planarization layer 117, and the pixel-defining layer 180 may have the opening OP through which at least a part of the first electrode 210 is exposed. At least a part of the surface 210a of the first electrode 210 may be exposed through the opening OP defined in the pixel-defining layer 180.

Figure 11:
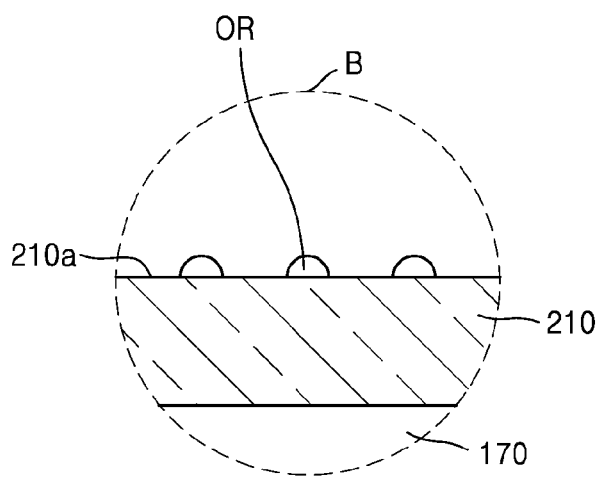

FIG. 11 is an enlarged view illustrating a region B of FIG. 10.

Referring to FIGS. 10 and 11, when the pixel-defining layer 180 having the opening OP through which at least a part of the surface 210a of the first electrode 210 is exposed is formed, organic residues OR may be formed on the surface 210a of the first electrode 210. The organic residues OR formed on the surface 210a of the first electrode 210 may be the same material as the pixel-defining layer 180. For example, the organic residues OR may include fluorine (F).

The fluorine (F) included in the organic residues OR formed on the surface 210a of the first electrode 210 may diffuse to the intermediate layer formed of an organic material and may contaminate the intermediate layer, thereby changing the characteristics of the organic light-emitting diode and reducing the life of the organic light-emitting diode.

Figure 12:
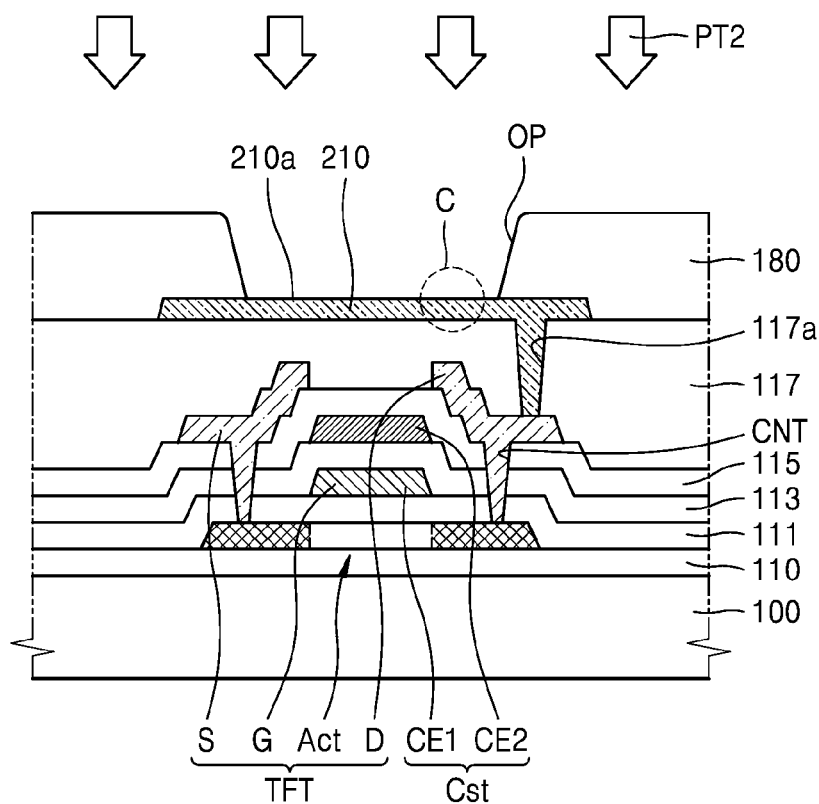

Referring to FIG. 12, after the pixel-defining layer 180 is formed, second dry cleaning PT2 for removing the organic residues OR formed on the surface 210a of the first electrode 210 may be performed.

In an embodiment, the second dry cleaning PT2 may be plasma treatment. The plasma treatment may be a method of applying high frequency waves to an oxygen ($O_2$) gas or an argon (Ar) gas to generate plasma, and irradiating the plasma to the surface 210a of the first electrode 210 to clean the surface 210a of the first electrode 210 through a chemical reaction.

In an embodiment, the second dry cleaning PT2 may be performed by injecting the oxygen ($O_2$) gas. Because the partial pressure of the oxygen ($O_2$) gas is higher than other gases, the organic residues OR generated when the pixel-defining layer 180 is formed may be effectively removed.

In an embodiment, the second dry cleaning PT2 may involve applying pressure, and may involve applying source power and bias power.

In an embodiment, the second dry cleaning PT2 may be performed at an etch rate of about 500 Å/min to about 1500 Å/min. In other embodiments, the second dry cleaning PT2 may be performed for about 15 seconds to about 45 seconds. The second dry cleaning PT2 may be performed at an etch rate in a range of about 500 Å/min to about 1500 Å/min for about 15 seconds to about 45 seconds. In an embodiment, the second dry cleaning PT2 may be performed at an etch rate of about 900 Å/min for about 30 seconds.

When an etch rate of the second dry cleaning PT2 is less than about 500 Å/min, the organic residues OR formed on the surface 210a of the first electrode 210 may remain without being removed, and when an etch rate of the second dry cleaning PT2 exceeds about 1500 Å/min, the uppermost layer of the first electrode 210 may be damaged. For example, an ITO electrode of the first electrode 210 may be damaged. Accordingly, when the second dry cleaning PT2 is performed at an etch rate of about 500 Å/min to about 1500 Å/min, the organic residues OR formed on the surface 210a of the first electrode 210 may be effectively removed while also preventing or minimizing damage to the first electrode 210.

Also, when the execution time of the second dry cleaning PT2 is less than about 15 seconds, the organic residues OR formed on the surface 210a of the first electrode 210 may remain without being removed, and when an execution time of the second dry cleaning PT2 is greater than about 45 seconds, an uppermost layer of the first electrode 210 may be damaged. For example, ITO of the first electrode 210 may be damaged. Accordingly, when the second dry cleaning PT2 is performed for about 15 seconds to about 45 seconds, the organic residues OR formed on the surface 210a of the first electrode 210 may be effectively removed and damage to the first electrode 210 may also be prevented or minimized.

In an embodiment, conditions for the first dry cleaning PT1 and the second dry cleaning PT2 may be the same. However, the disclosure is not limited thereto.

Figure 13:
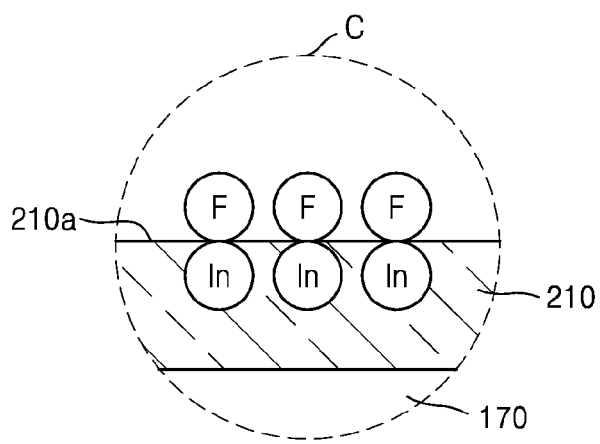
Figure 14:
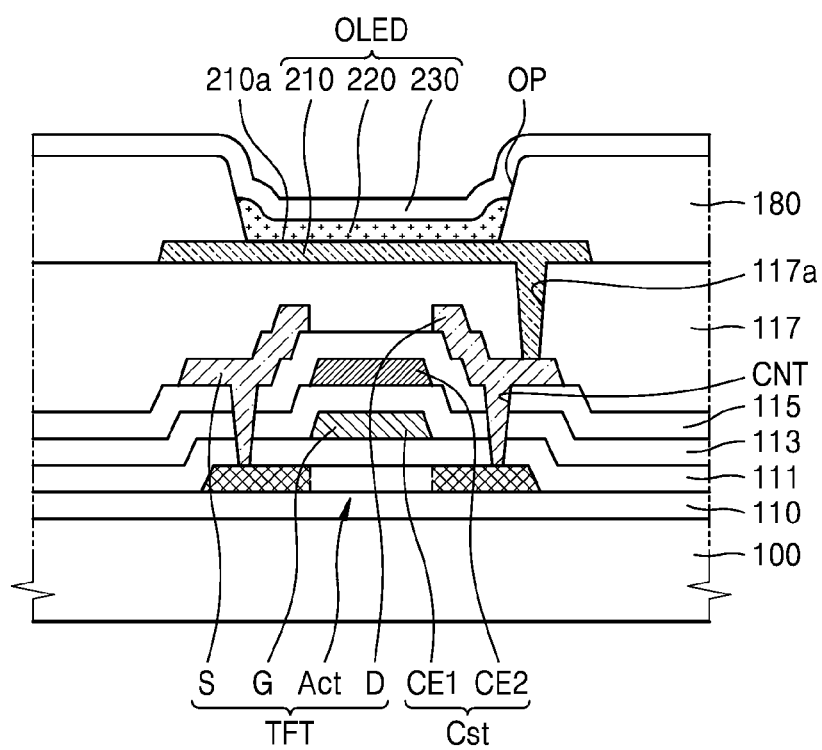

FIG. 13 is an enlarged view illustrating a region C of FIG. 12.

Referring to FIGS. 12 and 13, the organic residues OR remaining on the surface 210a of the first electrode 210 may be removed by performing the second dry cleaning PT2.

Also, when plasma is irradiated to the surface 210a of the first electrode 210 during the second dry cleaning PT2, an indium-fluorine (In—F) bond may be formed on the surface 210a of the first electrode 210. The indium-fluorine (In—F) bond on the surface 210a of the first electrode 210 may increase the work function of the surface 210a of the first electrode 210, and thus may improve hole injection characteristics and may improve characteristics of the organic light-emitting diode OLED Referring to FIG. 14, after the second dry cleaning PT2 is performed on the surface 210a of the first electrode 210, the intermediate layer 220 and the second electrode 230 may be formed.

In an embodiment, the intermediate layer 220 including an emission layer may be formed in the opening OP defined in the pixel-defining layer 180. In an embodiment, the intermediate layer 220 may include an organic material. The intermediate layer 220 may include a first functional layer, the emission layer, and a second functional layer. The first functional layer and the second functional layer may be respectively selectively located under and over the emission layer. In an embodiment, the first functional layer may be located under the emission layer, and the second functional layer may be located over the emission layer. The first functional layer and the second functional layer located under and over the emission layer may be collectively referred to as organic functional layers. Although not shown in FIG. 14, the organic functional layers may be located in the display area DA (refer to FIG. 1), to cover the entire display area DA. The organic functional layers may be integrally formed throughout the display area to cover the pixels PX formed in the display area DA. However, the disclosure is not limited thereto.

The second electrode 230 may be formed on the intermediate layer 220. The second electrode 230 may be formed on the intermediate layer 220, to cover the entire intermediate layer 220. The second electrode 230 may be located in the display area DA, to cover the entire display area DA. The second electrode 230 may be integrally formed throughout the display area to cover the pixels PX located in the display area DA by using an open mask. However, the disclosure is not limited thereto.

Figure 15:
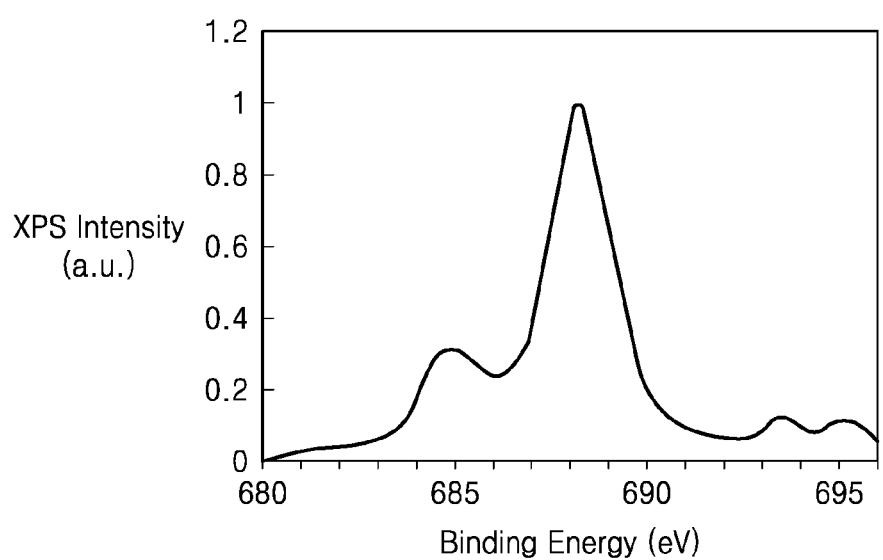
FIG. 15 is a graph illustrating an X-ray photoelectron spectroscopy (XPS) analysis result on a surface of a first electrode.

FIG. 15 illustrates an X-ray photoelectron spectroscopy (XPS) analysis result on a surface of a first electrode. An XPS analysis result on a surface of a first electrode is illustrated as an F1s spectrum.

Referring to FIG. 15, as a result of analyzing the surface 210a of the first electrode 210 by using XPS, a peak may be observed when a binding energy of the XPS spectrum (F1s spectrum) ranges from about 683 eV to about 687 eV.

As a result of analyzing the surface 210a of the first electrode 210 by using the XPS, the sub-peak when a binding energy of the XPS spectrum ranges from about 683 eV to about 687 eV may mean that an indium-fluorine (In—F) bond exists on the surface 210a of the first electrode 210.

Accordingly, when the surface 210a of the first electrode is dry cleaned by using an oxygen ($O_2$) gas, an indium-fluorine (In—F) bond may be formed on the surface 210a of the first electrode 210.

Figure 16:
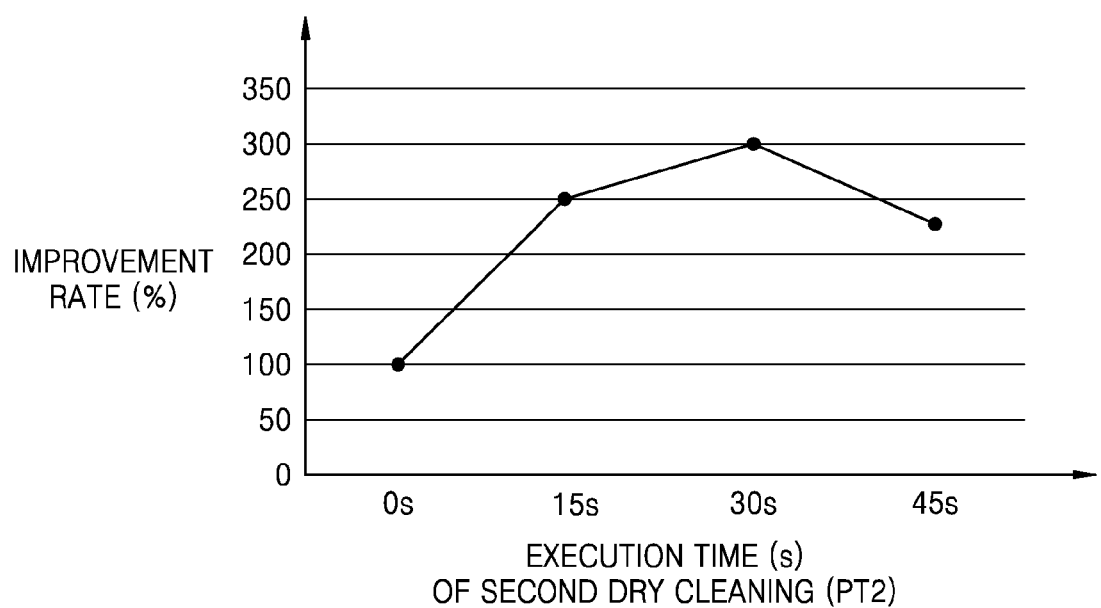
FIG. 16 is a graph illustrating an improvement of the life of a blue (B) luminance according to an execution time of second dry cleaning.

FIG. 16 is a graph illustrating the improvement rate of a blue (B) luminance life according to the execution time of the second dry cleaning. FIG. 16 illustrates the improvement rates (%) of a B luminance life when the second dry cleaning PT2 was omitted (0s) and when the execution time of the second dry cleaning PT2 (in seconds s) was changed. The second dry cleaning was performed at an etch rate of about 900 Å/min.

Referring to FIG. 16, when the second dry cleaning PT2 was performed for about 15 seconds, the improvement of the B luminance life was about 260%; when the second dry cleaning PT2 was performed for about 30 seconds, the improvement of the B luminance life was about 300%; and when the second dry cleaning PT2 was performed for about 45 seconds, the improvement rate of the B luminance life was about 230%. The B luminance life was higher when the second dry cleaning PT2 was performed on the surface 210a of the first electrode 210 than when the second dry cleaning PT2 was not performed.

When the second dry cleaning PT2 was performed for about 30 seconds, the improvement of the B luminance life was the highest.

Accordingly, when the second dry cleaning PT2 is performed on the surface 210a of the first electrode 210 for about 15 seconds to about 45 seconds, the organic residues OR on the surface 210a of the first electrode 210 are removed, thereby preventing or minimizing damage to the organic light-emitting diode OLED due to the organic residues OR and improving the life of the organic light-emitting diode OLED.

Figure 17:
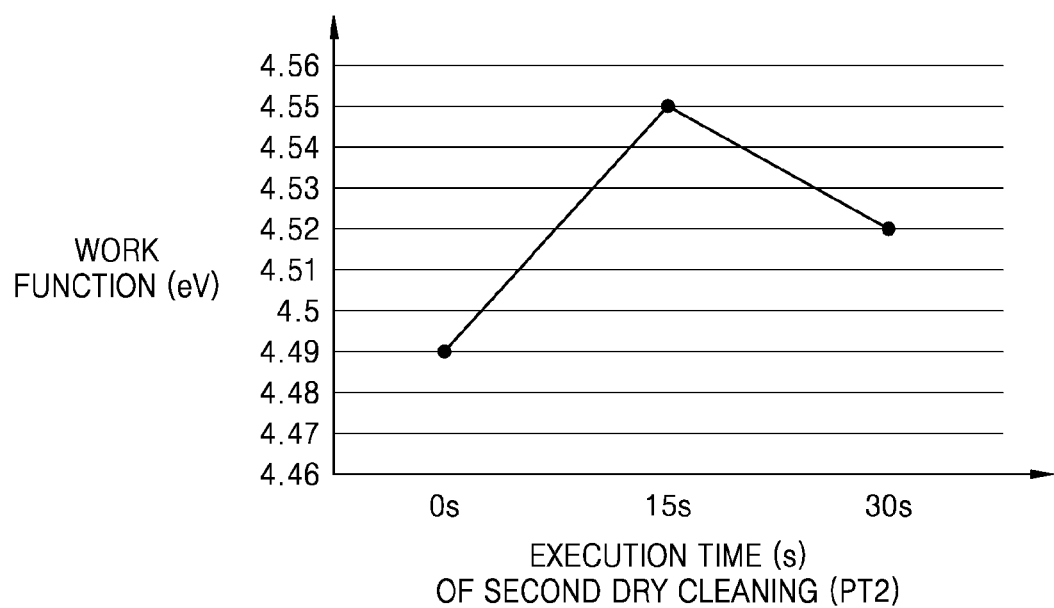
FIG. 17 is a graph illustrating a work function of a surface of a first electrode according to an execution time of second dry cleaning.

FIG. 17 is a graph illustrating the work function of a surface of a first electrode according to an execution time of second dry cleaning. The second dry cleaning PT2 was performed at an etch rate of about 900 Å/min.

Referring to FIG. 17, the work function of the surface 210a of the first electrode 210 when the second dry cleaning PT2 was not performed was about 4.49 eV but the work function of the surface 210a of the first electrode 210 was about 4.55 eV when the second dry cleaning PT2 was performed for about 15 seconds and the work function of the surface 210a of the first electrode 210 was about 4.52 eV when the second dry cleaning PT2 was performed for about 30 seconds. Thus, the work function of the surface 210a of the first electrode 210 was higher when the second dry cleaning PT2 was performed on the surface 210a than when the second dry cleaning PT2 was not performed.

When the second dry cleaning PT2 is performed on the surface 210a of the first electrode 210, an indium-fluorine (In—F) bond is formed on the surface 210a of the first electrode 210, and thus the work function of the first electrode 210 (e.g., the work function of the surface 210a of the first electrode 210) may increase, thereby improving the hole injection characteristics of the first electrode 210 (or the surface 210a of the first electrode 210).

According to the embodiments, a display apparatus including a light-emitting device having an improved life and a method of manufacturing the display apparatus may be provided. However, the disclosure is not limited to these effects.

It should be understood that embodiments described herein should be interpreted in a generic and descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. While the embodiments have been described with reference to the figures, it will be understood by those of ordinary skill in the art that various changes in form and details may be made therein without departing from the spirit and scope of the disclosure as set forth in the following claims.

What is claimed is:

1. A method of manufacturing a display apparatus, the method comprising:
   forming a first electrode on a substrate;
   forming a pixel-defining layer on the first electrode, the pixel-defining layer including an opening through which at least part of the first electrode is exposed; and
   performing a first dry cleaning on a surface of the at least part of the first electrode that is exposed through the opening,
   wherein an indium-fluorine bond is formed on the surface of the at least part of the first electrode through the first dry cleaning; wherein the performing of the first dry cleaning includes removing an organic residue from the surface of the at least part of the first electrode; wherein the organic residue and the pixel defining layer include a same material; wherein a time of the performing of the first dry cleaning is in a range of about 15 seconds to about 45 seconds; and wherein an etch rate of the performing of the first dry cleaning is in a range of about 500 Å/min to about 1500 Å/min.

2. The method of claim 1, wherein the performing of the first dry cleaning uses an oxygen gas.

3. The method of claim 1, wherein the first electrode includes indium tin oxide.

4. The method of claim 3, wherein the surface of the first electrode exhibits a peak in a binding energy in a range of about 683 eV to about 687 eV of an X-ray photoelectron spectroscopy spectrum.

5. The method of claim 1, further comprising, before the forming of the first electrode:
   forming a planarization layer on the substrate;
   forming a via hole in the planarization layer; and
   performing a second dry cleaning on the planarization layer and the via hole.

6. The method of claim 5, wherein
   an etch rate of the performing of the second dry cleaning is in a range of about 500 Å/min to about 1500 Å/min, and
   a time of the performing of the second dry cleaning is in a range of about 15 seconds to about 45 seconds.

7. The method of claim 5, wherein the performing of the second dry cleaning uses an oxygen gas.

8. The method of claim 1, further comprising, after the performing of the first dry cleaning:
   forming an intermediate layer on the first electrode; and
   forming a second electrode on the intermediate layer.

9. The method of claim 8, wherein the intermediate layer includes an organic material.

10. The method of claim 1, wherein the pixel-defining layer includes fluorine.

* * * * *